United States Patent
Kato et al.

(10) Patent No.: US 8,238,476 B2
(45) Date of Patent: Aug. 7, 2012

(54) SEMICONDUCTOR DEVICE AND DRIVING METHOD THEREOF

(75) Inventors: Kiyoshi Kato, Kanagawa (JP); Yutaka Shionoiri, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 13/010,209

(22) Filed: Jan. 20, 2011

(65) Prior Publication Data

US 2011/0111721 A1    May 12, 2011

Related U.S. Application Data

(63) Continuation of application No. 12/821,588, filed on Jun. 23, 2010, now Pat. No. 7,876,859, which is a continuation of application No. 11/358,636, filed on Feb. 21, 2006, now Pat. No. 7,751,498.

(30) Foreign Application Priority Data

Feb. 28, 2005   (JP) ................................. 2005-055197

(51) Int. Cl.
*H03K 9/00* (2006.01)
(52) U.S. Cl. ........................................................ 375/316
(58) Field of Classification Search .................. 330/277, 330/253, 255; 375/316
See application file for complete search history.

(56) References Cited

U.S. PATENT DOCUMENTS

| | | | |
|---|---|---|---|
| 4,937,476 A * | 6/1990 | Bazes ............................ | 330/277 |
| 5,165,054 A * | 11/1992 | Platt et al. ...................... | 330/277 |
| 5,434,520 A | 7/1995 | Yetter et al. | |
| 5,889,273 A | 3/1999 | Goto | |
| 5,949,280 A | 9/1999 | Sasaki | |
| 6,031,419 A | 2/2000 | Roberts et al. | |
| 6,049,639 A | 4/2000 | Paniccia et al. | |
| 6,100,804 A | 8/2000 | Brady et al. | |
| 6,392,369 B1 | 5/2002 | Kim | |
| 6,509,217 B1 | 1/2003 | Reddy | |
| 6,529,050 B1 | 3/2003 | Kuo et al. | |

(Continued)

FOREIGN PATENT DOCUMENTS

EP    0 764 920 A2    3/1997

(Continued)

OTHER PUBLICATIONS

Wang, Z., "Novel CMOS Inverter with Linearly Adjustable Threshold Voltage Using Only Three MOS Transistors," Microelectronics Journal, vol. 22, Nos. 5-6, Sep. 1991, pp. 75-79.

(Continued)

*Primary Examiner* — Khanh V Nguyen
(74) *Attorney, Agent, or Firm* — Husch Blackwell LLP

(57) ABSTRACT

The invention provides a semiconductor device with high yield by reducing an effect of variations in characteristics of a semiconductor element. Further, by reducing an effect of variations in characteristics of a semiconductor element to improve productivity, an inexpensive semiconductor device can be provided. Further, an inexpensive semiconductor device can be provided by forming a semiconductor device in a large amount over a large substrate such as a glass substrate and a flexible substrate. A semiconductor device of the invention includes a demodulation signal generating circuit and an antenna or a wire for connecting the antenna. The demodulation signal generating circuit includes a demodulation circuit and a correction circuit. The correction circuit corrects a first demodulation signal generated from the demodulation circuit and generates a second demodulation signal.

14 Claims, 8 Drawing Sheets

U.S. PATENT DOCUMENTS

| | | |
|---|---|---|
| 6,621,720 B1 | 9/2003 | Devin et al. |
| 6,850,080 B2 | 2/2005 | Hiroki |
| 6,891,391 B2 | 5/2005 | Hiroki |
| 7,034,581 B2 | 4/2006 | Sudou |
| 7,088,140 B1 | 8/2006 | Nguyen et al. |
| 7,518,692 B2 | 4/2009 | Yamazaki et al. |
| 7,652,359 B2 | 1/2010 | Takayama et al. |
| 7,863,116 B2 | 1/2011 | Takayama et al. |
| 7,973,313 B2 | 7/2011 | Arai et al. |
| 2002/0094639 A1 | 7/2002 | Reddy |
| 2004/0007706 A1 | 1/2004 | Yamazaki et al. |
| 2004/0155755 A1 | 8/2004 | Bui et al. |
| 2004/0178265 A1 | 9/2004 | Bui et al. |
| 2004/0195572 A1 | 10/2004 | Kato et al. |
| 2004/0246054 A1 | 12/2004 | Womac |
| 2004/0251981 A1 | 12/2004 | Arisawa |
| 2005/0006648 A1 | 1/2005 | Yamazaki et al. |
| 2005/0078495 A1 | 4/2005 | Koyama et al. |
| 2005/0083129 A1 | 4/2005 | Tsurumaki et al. |
| 2005/0153498 A1 | 7/2005 | Kim |
| 2005/0192129 A1 | 9/2005 | Kuwabara |
| 2005/0212044 A1 | 9/2005 | Hiroki |
| 2005/0218926 A1 | 10/2005 | Hiroki |
| 2006/0091213 A1 | 5/2006 | Bui et al. |
| 2011/0092025 A1 | 4/2011 | Takayama et al. |
| 2011/0223966 A1 | 9/2011 | Arai et al. |

FOREIGN PATENT DOCUMENTS

| | | |
|---|---|---|
| EP | 0 829 987 A2 | 3/1998 |
| EP | 1 437 683 A2 | 7/2004 |
| EP | 1 437 695 A2 | 7/2004 |
| EP | 1 453 088 A2 | 9/2004 |
| JP | 7-296127 | 11/1995 |
| JP | 9-81701 | 3/1997 |
| JP | 11-304887 | 11/1999 |
| JP | 2001-260580 | 9/2001 |
| JP | 2001-266102 | 9/2001 |
| JP | 2004-70453 | 3/2004 |
| JP | 2004-220587 | 8/2004 |
| JP | 2004-220591 | 8/2004 |
| JP | 2004-282050 | 10/2004 |
| JP | 2004-349841 | 12/2004 |

OTHER PUBLICATIONS

European Search Report re application No. EP 06002971.7, dated Jun. 14, 2006.

* cited by examiner

SEMICONDUCTOR DEVICE AND DRIVING METHOD THEREOF

This application is a continuation of application Ser. No. 12/821,588 filed on Jun. 23, 2010 now U.S. Pat. No. 7,876,859 which is a continuation of application Ser. No. 11/358,636 filed on Feb. 21, 2006 (now U.S. Pat. No. 7,751,498 issued Jul. 6, 2010).

BACKGROUND OF THE INVENTION

1. Field of the Invention Signature

The present invention relates to a semiconductor device capable of transmitting/receiving data wirelessly and a driving method thereof.

2. Description of the Related Art

In recent years, a semiconductor device capable of transmitting/receiving data wirelessly has been advanced and attracting attentions. Such a semiconductor device is, for example, an RFID (Radio Frequency Identification), an RF chip, an RF tag, an IC chip, an IC tag, a wireless chip, a wireless tag, an electron chip, an electron tag, a wireless processor, or a wireless memory, which is already introduced into some markets. Among them, a semiconductor device for managing objects is advanced, which is small, lightweight, easy to use, high in security, and low cost.

SUMMARY OF THE INVENTION

A semiconductor device which can transmit/receive data wirelessly is formed of an analog circuit which receives and transmits data through electromagnetic waves and a logic circuit which outputs transmission data with received data as input. The analog circuit and the logic circuit are formed of semiconductor elements. If such a semiconductor device including an analog circuit and a logic circuit is formed of semiconductor elements provided over a glass substrate, a flexible substrate, and the like, variations in characteristics of the semiconductor elements (typically a threshold value of a transistor and a resistance value of a semiconductor layer) affect the semiconductor device. In particular, the analog circuit (typically a demodulation circuit) does not operate normally due to the effect of variations in characteristics of semiconductor elements, which is a major factor to reduce yield.

The invention provides a semiconductor device with high yield by reducing an effect of variations in characteristics of a semiconductor element. Further, the invention provides an inexpensive semiconductor device by improving productivity by reducing the effect of variations in characteristics of a semiconductor element. Furthermore, the invention provides an inexpensive semiconductor device by manufacturing a large amount of semiconductor devices over a large substrate such as a glass substrate or a flexible substrate.

A semiconductor device of the invention includes a resonant circuit having an antenna, a demodulation circuit which generates a first demodulation signal by demodulating an alternating signal generated at the resonant circuit, and a correction circuit which generates a second demodulation signal by correcting the first demodulation signal.

In the aforementioned configuration, the correction circuit includes a level shifter. Further, the correction circuit includes a differential amplifier.

Further, the correction circuit includes an inverter. The inverter has input/output characteristics of which changing point is at a voltage level within a range of 25 to 45% of a power source voltage. Alternatively, the inverter has input/output characteristics of which changing point is at a voltage level within a range of 55 to 75% of a power source voltage.

Further, the correction circuit includes an inverter formed of an N-channel transistor and a P-channel transistor. The inverter has input/output characteristics of which changing point is at a voltage level within a range of 25 to 45% of a power source voltage. A channel width of an N-channel transistor is wider than that of a P-channel transistor. More specifically, a channel width of an N-channel transistor is 1 to 10 times as wide as that of a P-channel transistor.

Further, the correction circuit includes an inverter formed of an N-channel transistor and a P-channel transistor. The inverter has input/output characteristics of which changing point is at a voltage level within a range of 25 to 45% of a power source voltage. An absolute value of a threshold voltage of a P-channel transistor is larger than an absolute value of a threshold voltage of an N-channel transistor.

Further, the correction circuit includes an inverter formed of an N-channel transistor and a P-channel transistor. The inverter has input/output characteristics of which changing point is at a voltage level within a range of 25 to 45% of a power source voltage. A channel length of a P-channel transistor is longer than that of an N-channel transistor.

Further, the correction circuit includes an inverter formed of an N-channel transistor and a P-channel transistor. The inverter has input/output characteristics of which changing point is at a voltage level within a range of 55 to 75% of a power source voltage. A channel width of a P-channel transistor is wider than that of an N-channel transistor. More specifically, a channel width of a P-channel transistor is 4 to 20 times as wide as that of an N-channel transistor.

Further, the correction circuit includes an inverter formed of an N-channel transistor and a P-channel transistor. The inverter has input/output characteristics of which changing point is at a voltage level within a range of 55 to 75% of a power source voltage. An absolute value of a threshold voltage of an N-channel transistor is larger than that of a P-channel transistor.

Further, the correction circuit includes an inverter formed of an N-channel transistor and a P-channel transistor. The inverter has input/output characteristics of which changing point is at a voltage level within a range of 55 to 75% of a power source voltage. A channel length of an N-channel transistor is longer than that of a P-channel transistor.

Further, the resonant circuit, the demodulation circuit, and the correction circuit are provided over the same substrate. The substrate is a glass substrate or a flexible substrate.

Further, the demodulation circuit and the correction circuit are provided over a first substrate and an antenna is provided over a second substrate. Each of the first substrate and the second substrate is a glass substrate or a flexible substrate.

Further, the demodulation circuit includes a plurality of thin film transistors. Further, the correction circuit includes a plurality of thin film transistors.

Further, a semiconductor device of the invention includes one or a plurality selected from a power source circuit, a clock generating circuit, a memory, a memory control circuit, and a modulation circuit.

Further, a demodulation signal generating circuit is provided over a glass substrate or a flexible substrate. Further, the demodulation signal generating circuit includes a thin film transistor. Further, a semiconductor device of the invention includes one or a plurality selected from a power source circuit, a clock generating circuit, a memory, a memory control circuit, and a modulation circuit.

Further, a driving method of a semiconductor device of the invention is that amplitude of a demodulation signal generated by a demodulation circuit formed of an analog circuit is corrected by a correction circuit. The correction circuit includes one selected from a level shifter, a differential amplifier, and an inverter.

According to the invention, even in the case where a first demodulation signal generated by the demodulation circuit is incomplete due to an effect of variations in characteristics of a semiconductor element, the first demodulation signal is inputted to a correction circuit to generate a second demodulation signal with equal amplitude to that of a power source voltage. Therefore, by using the invention, an effect of variations in characteristics of a semiconductor element can be suppressed, thereby an inexpensive semiconductor device can be provided by realizing high yield and improving productivity. Further, a semiconductor device of the invention which can be manufactured in a large amount over a large substrate such as a glass substrate or a flexible substrate can be provided at low cost.

DETAILED DESCRIPTION OF THE INVENTION

Figure 1:
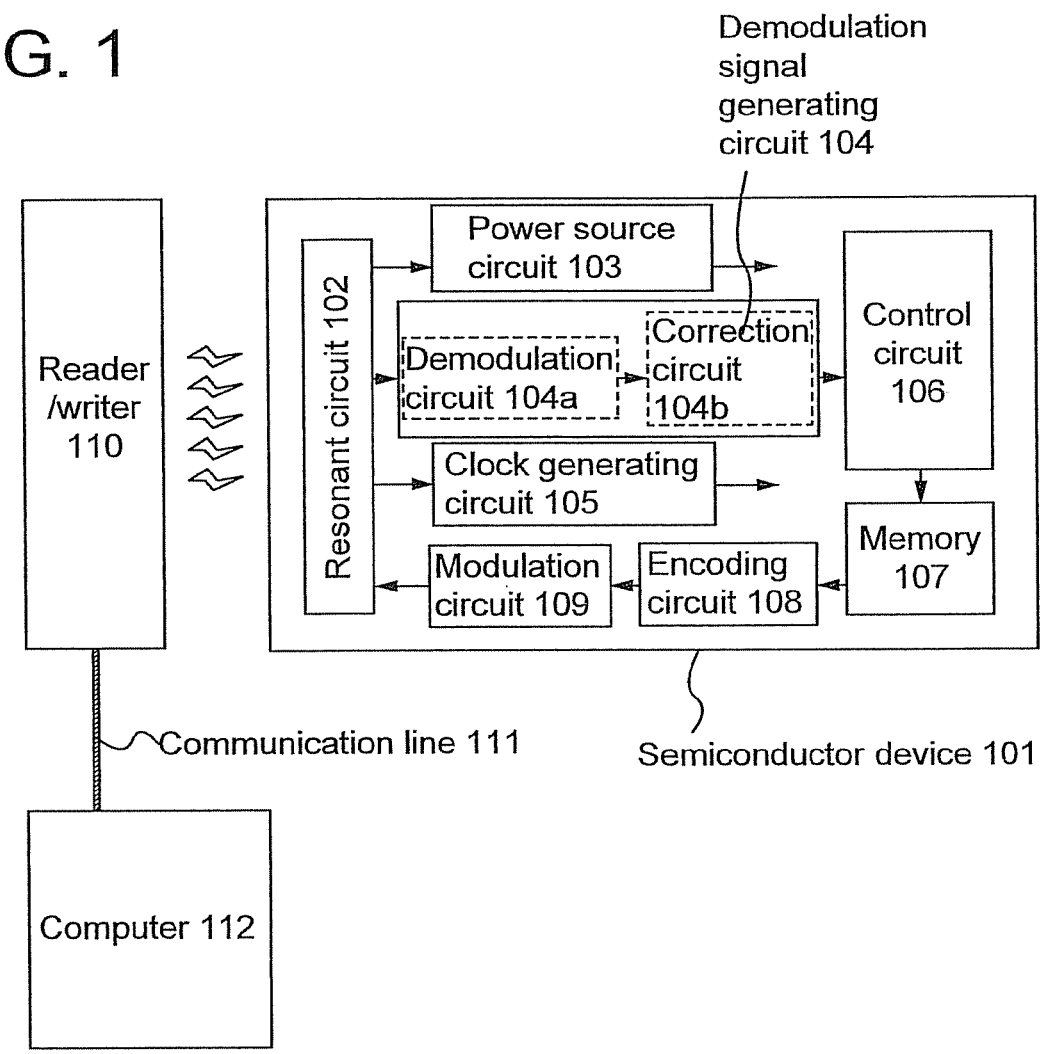
FIG. 1 is a diagram showing a semiconductor device of the invention and peripheral devices.

Although the invention will be fully described by way of embodiment modes and embodiments with reference to the accompanying drawings, it is to be understood that various changes and modifications will be apparent to those skilled in the art. Therefore, unless such changes and modifications depart from the scope of the invention, they should be construed as being included therein. Note that identical portions in the configurations of the invention may be denoted by the same reference numerals.

Embodiment Mode 1

Description is made with reference to FIG. 1 on a configuration of a semiconductor device of the invention and of a peripheral device thereof. A semiconductor device 101 of the invention transmits and receives data to/from a reader/writer 110 wirelessly through electromagnetic waves. The reader/writer 110 is connected to a computer 112 through a communication line 111. The computer 112 controls communication between the reader/writer 110 and the semiconductor device 101.

The semiconductor device 101 includes a resonant circuit 102 comprising an antenna and a resonant capacitor, a power source circuit 103, a demodulation signal generating circuit 104, a clock generating circuit 105, a control circuit 106, a memory 107, an encoding circuit 108, and a modulation circuit 109. Further, the semiconductor device 101 does not include an antenna but may include a wire for connecting the antenna in some cases. In these cases, a separately manufactured antenna is connected to the wire to use the semiconductor device. Further, the semiconductor device 101 is not limited to the aforementioned configuration and may include a central processing unit (CPU), a congestion control circuit, and the like.

The resonant circuit 102 generates an alternating dielectric voltage by receiving electromagnetic waves transmitted from the reader/writer 110. This dielectric voltage corresponds to a power source of the semiconductor device 101 and contains data transmitted from the reader/writer 110. The power source circuit 103 rectifies a dielectric voltage generated at the resonant circuit 102 by using a diode and stabilizes it by using a capacitor, thereby a constant power source voltage and a ground voltage (hereinafter referred to as a GND voltage) are generated. The demodulation signal generating circuit 104 demodulates and captures data contained in the dielectric voltage generated at the resonant circuit 102. The clock generating circuit 105 generates a clock signal at a required frequency based on an alternating dielectric voltage generated at the resonant circuit 102. The control circuit 106 controls the memory 107. Here, the control circuit 106 generates a memory control signal and includes a decoding circuit, a data decision circuit, and the like. The memory 107 holds data specific to the semiconductor device 101. In the case where the semiconductor device 101 is a passive type without a battery, the memory 107 is preferably a nonvolatile memory. The encoding circuit 108 converts data stored in the memory 107 into an encoded signal. The modulation circuit 109 modulates carrier waves based on the encoded signal.

A semiconductor device of this embodiment mode has no battery and is driven while receiving power supply from the reader/writer through electromagnetic waves, however, the invention is not limited to this. The semiconductor device may be driven while receiving power supply from a battery provided therein.

The electromagnetic waves transmitted from the reader/writer have the carrier waves at a prescribed frequency modulated by sub-carrier waves. The sub-carrier waves are digital signals having binary values to be transmitted from the reader/writer to the semiconductor device. Modulating methods of carrier waves include an ASK (Amplitude Shift Keying) modulation method to change an amplitude, a PSK (Phase Shift Keying) modulation method to change a phase, and an FSK (Frequency Shift Keying) modulation method to change a frequency. Hereafter described is the case of demodulating electromagnetic waves modulated by the ASK modulation method. However, the invention is not limited to the ASK modulation method and is also applied to the case where the electromagnetic waves modulated by another modulation method are demodulated.

Figure 2A:
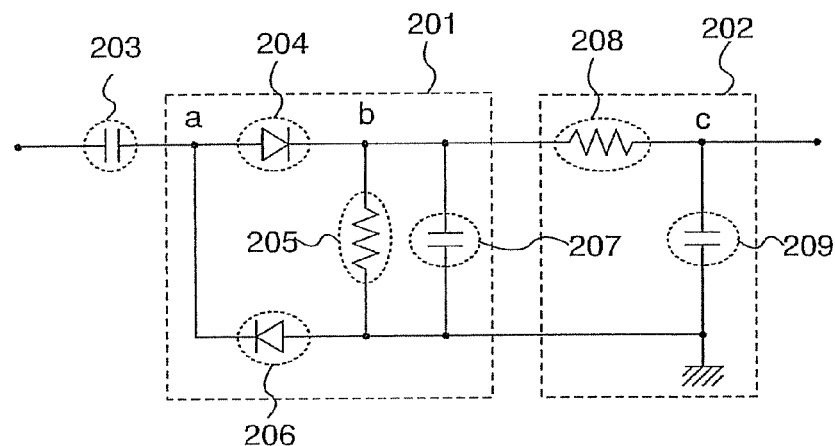
FIGS. 2A and 2B are diagrams showing a demodulation circuit included in a semiconductor device of the invention and an operation thereof.

The demodulation signal generating circuit 104 of the semiconductor device 101 includes a demodulation circuit 104a and a correction circuit 104b. The demodulation circuit 104a is formed of, for example, a capacitor 203, diodes 204 and 206, resistors 205 and 208, and capacitors 207 and 209 as shown in FIG. 2A. The demodulation circuit 104a is inputted with alternating signals generated at the resonant circuit 102. Further, the demodulation circuit 104a generates a first demodulation signal obtained by demodulating sub-carrier waves. It is to be noted that the demodulation circuit 104a is not limited to have the circuit configuration shown in FIG. 2A. The correction circuit 104b is formed of, for example, a known level shifter and generates a second demodulation signal obtained by correcting the first demodulation signal.

In general, the demodulation signal generated by the demodulation circuit is inputted to a memory control circuit and the like. The demodulation signal is inputted to operate a logic circuit, therefore, the demodulation signal is required to be a digital signal having binary values. However, the demodulation circuit which is formed of an analog circuit and affected by variations in characteristics of a semiconductor element cannot easily generate a complete digital signal. Accordingly, in the invention, the demodulation signal generating circuit is formed of a demodulation circuit and a correction circuit for generating digital signals. Then, by inputting a first demodulation signal outputted from the demodulation circuit to the correction circuit, a second demodulation signal is generated as a digital signal. Here, correction of the first demodulation signal corresponds to an operation to input the first demodulation signal to the correction circuit and generate the second demodulation signal by the correction circuit.

Figure 2B:
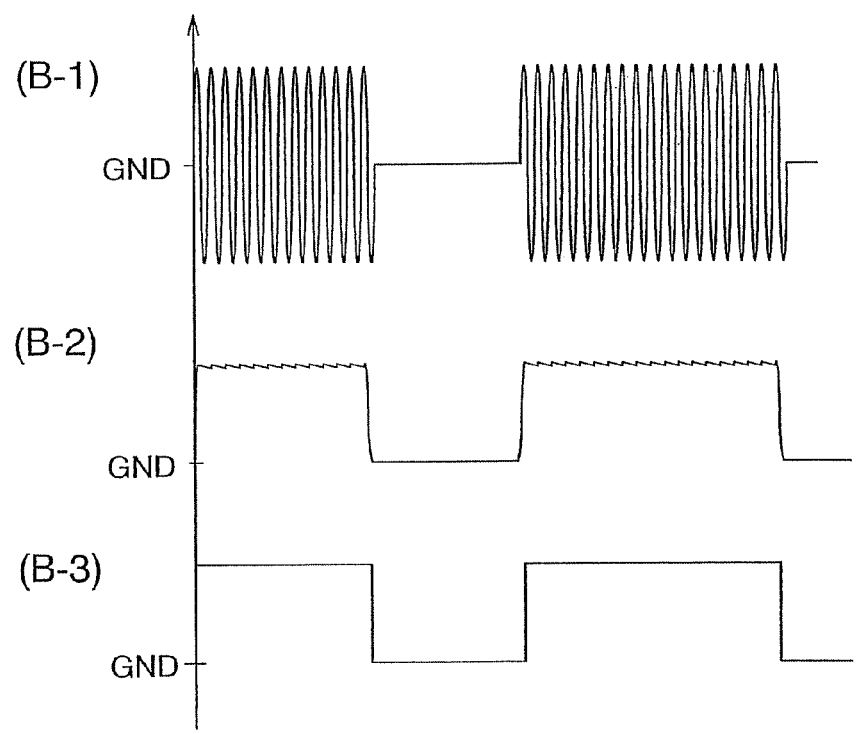

Description is made on the demodulation circuit 104a shown in FIG. 2A. In FIG. 2A, the resistors 205 and 208 have resistance of R1 and R2 respectively and the capacitors 207 and 209 have capacitance of C1 and C2 respectively. FIG. 2B shows operation waveforms at nodes a, b, and c in FIG. 2A. The operation waveforms at the nodes a, b, and c are shown by (B-1), (B-2), and (B-3) in FIG. 2B respectively. A signal at the node a is an alternating dielectric voltage generated at the resonant circuit and has high frequency carrier waves modulated by low frequency sub-carrier waves (see (B-1) in FIG. 2B). By appropriately setting the amount of current flowing to the resistor 205 and of charge accumulated in the capacitor 207 in a circuit 201, a signal at the node b is obtained (see (B-2) in FIG. 2B). The signal at the node b contains high frequency components with small amplitude, therefore, the first demodulation signal as a digital signal having a Low level (hereinafter referred to as a Lo level) and a High level (hereinafter referred to as a Hi level) potential (voltage) is obtained by providing a low pass filter 202 which cuts off frequency components higher than that of the sub-carrier waves (see (B-3) in FIG. 2B).

In this manner, the demodulation circuit 104a has operation characteristics determined in accordance with the resistance R1 and R2 of the resistors 205 and 208 respectively and the capacitance C1 and C2 of the capacitors 207 and 209 respectively. A semiconductor element formed over a single crystalline silicon substrate has small variations in characteristics, therefore, a logic circuit normally operates even when a first demodulation signal at the node c outputted from the demodulation circuit 104a is inputted to the logic circuit. A semiconductor element formed over a glass substrate or a flexible substrate, however, has a problem in that there are large variations in characteristics such as resistance of a semiconductor layer and a threshold voltage of a transistor. As a result, variations in operation characteristics of the demodulation circuit 104a become large. The operation characteristics of the demodulation circuit shown in FIG. 2B are the case where a semiconductor element has ideal characteristics. FIGS. 3A to 3D show operation characteristics of a demodulation circuit which is affected by variations in characteristics of a semiconductor element.

Figure 3A:
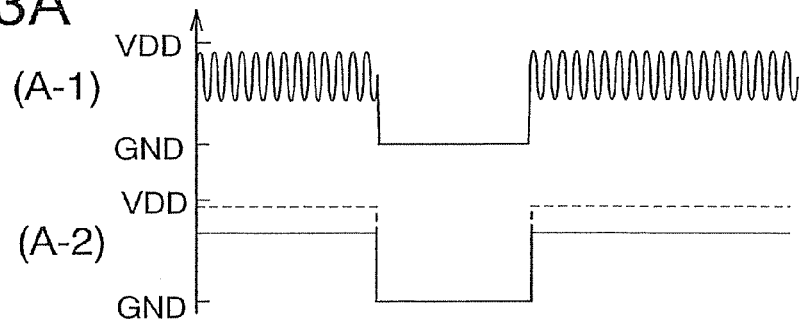
FIGS. 3A to 3D are diagrams showing variations in output characteristics of the demodulation circuit.

FIG. 3A shows the case where high frequency components with large amplitude remain at the node b as an amount of current flowing to the resistor 205 in the circuit 201 of the demodulation circuit 104a is large (see (A-1) in FIG. 3A). When a signal at the node b is inputted to the low pass filter 202, a Hi level signal having a lower voltage than a power source voltage is outputted at the node c (see (A-2) in FIG. 3A). In particular, in the case where the amplitude of a Hi level signal which is generated by the demodulation circuit 104a is smaller than that of a threshold value (a voltage as a boundary to distinguish between a Lo level and a Hi level) of the logic circuit, the signal is not recognized as a Hi level signal when inputted to the logic circuit as a demodulation signal, which causes a semiconductor device to malfunction.

Figure 3B:
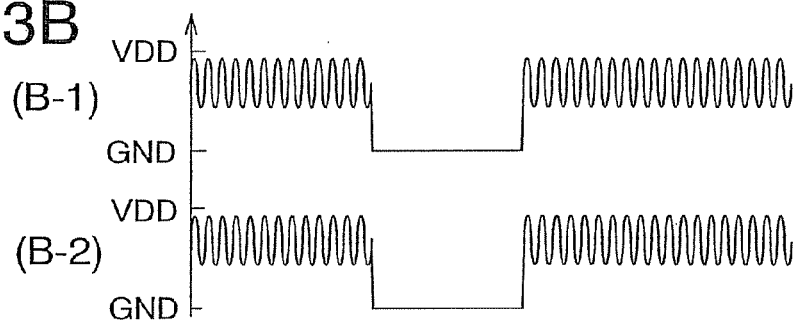

FIG. 3B shows the case where high frequency components with large amplitude remain at the node b (see (B-1) in FIG. 3B) similarly to FIG. 3A and frequency components of carrier waves cannot be cut off due to variations in the resistance R2 of the resistor 208 and the capacitance C2 of the capacitor 209 in the low pass filter 202 to output at the node c (see (B-2) in FIG. 3B). In particular, in the case where a Hi level signal at the node c having noise is lower than a threshold voltage of the logic circuit, the noise and the signal cannot be distinguished when directly inputted to the logic circuit as a demodulation signal, which causes the semiconductor device to malfunction.

Figure 3C:
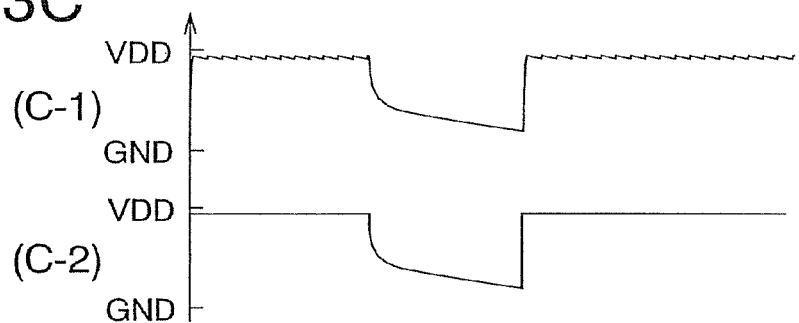

FIG. 3C shows the case where the amount of current flowing to the resistor 205 is small in the circuit 201 of the demodulation circuit 104a and thus a Lo level signal which does not become as low as a GND voltage is outputted at the node b (see (C-1) in FIG. 3C). When the signal at the node b is inputted to the low pass filter 202, high frequency components are cut off, however, the Lo level signal which remains higher than the GND voltage is outputted (see (C-2) in FIG. 3C). In particular, in the case where amplitude of a Lo level signal at the node c becomes higher than the threshold value of the logic circuit, the signal is not recognized as a Lo level signal when directly inputted to the logic circuit as a demodulation signal, which causes a malfunction.

Figure 3D:
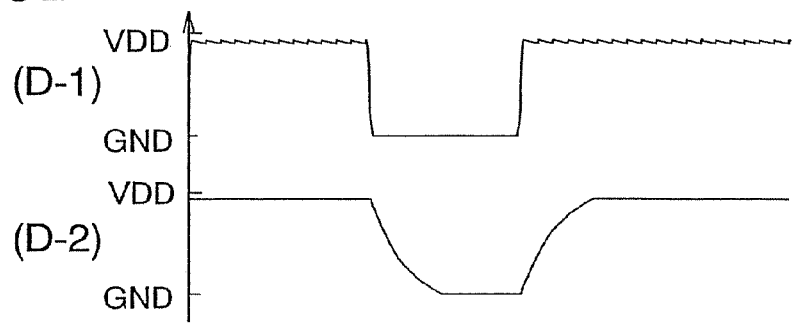

FIG. 3D shows the case where even frequency components of sub-carrier waves are cut due to the variations in the resistance R2 of the resistor 208 and the capacitance C2 of the capacitor 209 in the low pass filter 202 even though the sub-carrier waves are demodulated by the circuit 201 (see (D-1) in FIG. 3D) and where there is a longer delay until a Lo level signal changes into a GND voltage at the node c, and the case where there is a longer delay until a Hi level signal changes into a power source voltage (see (D-2) in FIG. 3D). When the signal at the node c is directly inputted to the logic circuit as a demodulation signal, a period in which the signal is recognized as a Lo level or Hi level signal changes, which causes a malfunction.

As described above, when characteristics of a semiconductor element vary, output characteristics of a demodulation circuit which is formed of an analog circuit may vary a lot. Therefore, the invention has a demodulation signal generating circuit formed of a demodulation circuit and a correction circuit. The correction circuit generates a second demodulation signal as a digital signal with equal amplitude to that of a power source voltage based on a first demodulation signal supplied by the demodulation circuit. In this manner, the invention which has the correction circuit in the demodulation signal generating circuit can generate a signal with equal amplitude to that of a power source voltage by suppressing an effect of variations in characteristics of a semiconductor element.

Figure 4A:
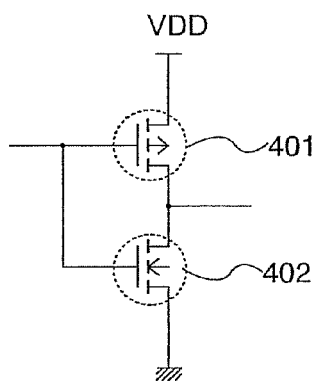
FIGS. 4A to 4D are diagrams showing an amplitude correction circuit included in a semiconductor device of the invention and output characteristics thereof.

The correction circuit 104b includes a level shifter or a differential amplifier. In this embodiment mode, as the correction circuit 104b, an inverter formed of an N-channel transistor 402 and a P-channel transistor 401 is used as an example (see FIG. 4A). The inverter has a changing point of input/output characteristics on a GND voltage side or a power source voltage (hereinafter also referred to as VDD) side intentionally, not around a voltage used for a normal logic circuit (VDD/2 when the power source voltage is VDD).

Figure 4B:
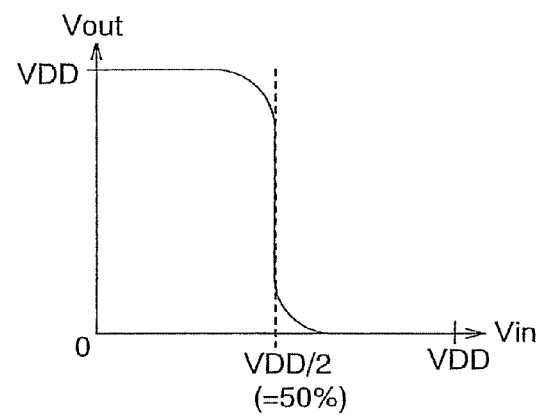

First, FIG. 4B shows input/output characteristics of an inverter used for a normal logic circuit. The inverter has a changing point of the input/output characteristics around VDD/2. This is because drive capabilities of the N-channel transistor and the P-channel transistor that form the inverter are almost the same. In such an inverter, mobility of the N-channel transistor (hereinafter referred to as $\mu_N$) is twice that of the P-channel transistor (hereinafter referred to as $\mu_P$), and when channel lengths of the two transistors are equal, a channel width of the P-channel transistor (hereinafter referred to as $W_P$) is twice that of the N-channel transistor (hereinafter referred to as $W_N$).

Figure 4C:
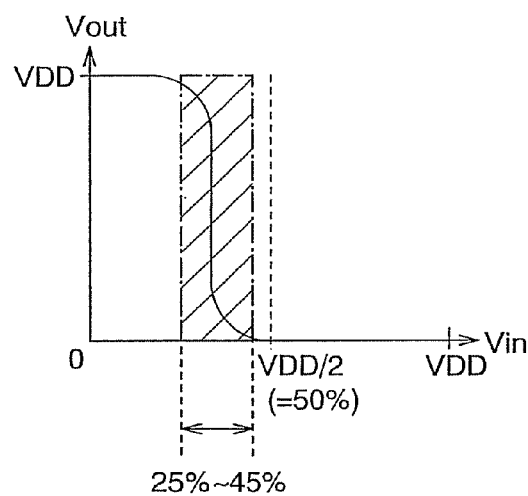
Figure 4D:
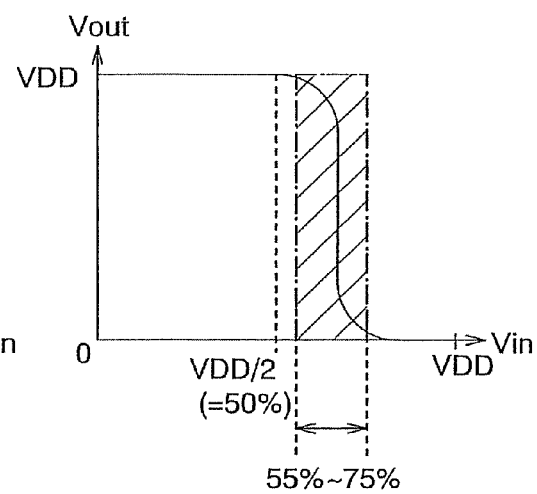

Next, input/output characteristics of an inverter included in a correction circuit are shown in FIGS. 4C and 4D. In FIG. 4C, a changing point of the input/output characteristics is set at a lower voltage than VDD/2 and in FIG. 4D, a changing point is set at a higher voltage than VDD/2. These input/output characteristics can be achieved by setting drive capabilities of the N-channel transistor and the P-channel transistor different, for example, by controlling the widths of $W_N$ and $W_P$.

The difference in the level between VDD/2 and the changing point of the input/output characteristics of the inverter is determined dependent on a threshold voltage of a transistor which forms the inverter and variations in the first demodulation signal outputted from the demodulation circuit affected by the variations in the semiconductor element. Here, when VDD as the power source voltage is 100% in percentage (VDD/2 corresponds to 50%), it is preferable to apply this embodiment mode to the case where amplitude of the first demodulation signal which is a Lo or Hi level varies about 20~60%. Accordingly, in the case where the Hi level signal outputted from the demodulation circuit decreases than the power source voltage by about 20~60% due to the variations in the semiconductor element, a changing point of the inverter included in the correction circuit is to be set about 25~45% of the power source voltage. On the contrary, in the case where the Lo level signal increases than the GND voltage by about 20~60%, a changing point of the inverter included in the correction circuit is to be set about 55~75% of the power source voltage.

An inverter having input/output characteristics of FIG. 4C can be manufactured by, for example, setting $W_N$ larger than $W_P$. More specifically, in the case where $\mu_N$ is twice $\mu_P$ and gate lengths of both transistors are the same, the inverter can be manufactured by setting $W_P$ 1 to 10 times as large as $W_N$. Or, a channel length of the P-channel transistor may be longer than that of the N-channel transistor. Further, an absolute value of a threshold voltage of the P-channel transistor may be larger than an absolute value of a threshold voltage of the N-channel transistor. By setting the input/output characteristics of the inverter in this manner, a second demodulation signal of which amplitude is corrected by the correction circuit 104b can be generated even when a Hi level signal shown in FIGS. 3A and 3B has a lower level than the power source voltage by about 20~60%.

An inverter having input/output characteristics of FIG. 4D can be manufactured by, for example, setting $W_P$ larger than $W_N$. More specifically, in the case where $\mu_N$ is twice $\mu_P$ and gate lengths of both transistors are the same, the inverter can be manufactured by setting $W_P$ 4~20 times as large as $W_N$. Or, a channel length of an N-channel transistor may be longer than that of a P-channel transistor. Further, an absolute value of a threshold voltage of an N-channel transistor may be larger than that of a P-channel transistor. By setting the input/output characteristics of the inverter in this manner, a second demodulation signal of which amplitude is corrected by the correction circuit 104b can be generated even when a Lo level signal shown in FIG. 3C has a higher level than the GND voltage by about 20~60%.

Further, the example to set the channel width of the transistor is described above as a method for setting drive capabilities of the two transistors which form the inverter in order to change the changing point of the input/output characteristics of the inverter from VDD/2 to the GND voltage side or the power source voltage side, however, the invention is not limited to this. For example, the changing point of the input/output characteristics of the inverter may also be determined by setting the threshold voltages of the N-channel transistor and the P-channel transistor and setting the channel lengths of the N-channel transistor and the P-channel transistor.

As described above, by forming the demodulation signal generating circuit included in the semiconductor device using the demodulation circuit and the correction circuit, a margin for the variations in characteristics of the semiconductor element drastically increases. That is, in the case where a correction circuit is not provided, a resistor and a capacitor of the demodulation circuit are required to be manufactured so as to have appropriate characteristic values which do not cause any of the cases of FIGS. 3A to 3C. Further, in the case where there are variations in element characteristics of the resistor and the capacitor, an incomplete demodulation signal is inputted to the logic circuit as shown in FIGS. 3A to 3C, thereby the semiconductor device malfunctions and the yield may decrease. With the configuration of the invention, however, the resistor and the capacitor may be manufactured to have a wide range of characteristic values that the case of FIGS. 3A, 3B, or 3C may occur. By correcting the demodulation signal even when there are variations in characteristics of the semiconductor element, a malfunction of the semiconductor element is reduced and the yield can be improved.

According to the invention, semiconductor devices can be formed in a large amount over a glass substrate or a flexible substrate which can be easily obtained and has a large area, therefore, a semiconductor device can be provided at low cost.

Embodiment Mode 2

Figure 5A:
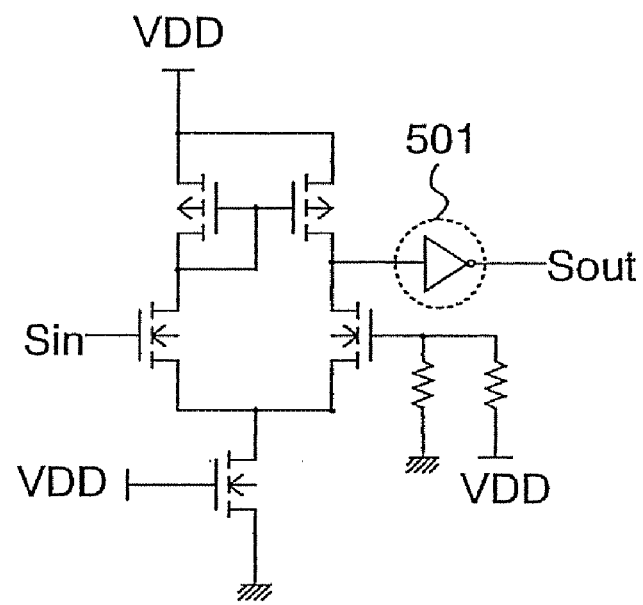
FIGS. 5A and 5B show examples of an amplitude correction circuit included in a semiconductor device of the invention.
Figure 5B:
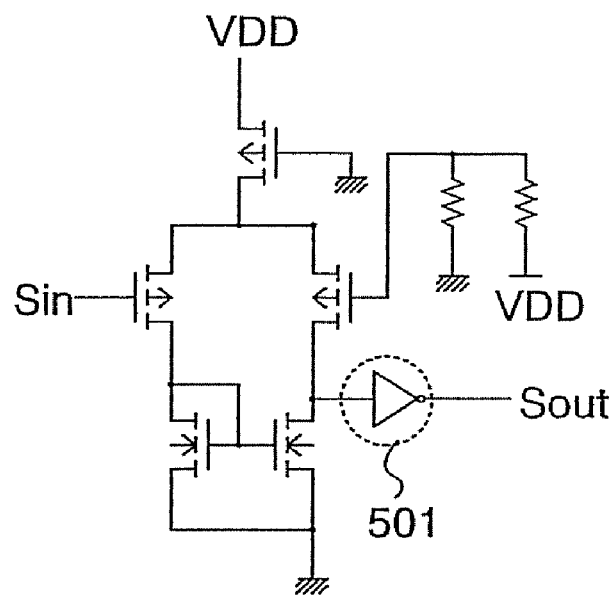

In this embodiment mode, description is made with reference to FIGS. 5A and 5B on a mode of the correction circuit 104b included in a semiconductor device of the invention, which is different from Embodiment Mode 1. The circuits shown in FIGS. 5A and 5B are differential amplifiers.

FIGS. 5A and 5B show differential amplifiers each of which has a configuration to compare a voltage generated at the middle of VDD and GND using resistance division and the first demodulation signal outputted from the demodulation circuit 104a. By controlling the level of the voltage generated by the resistance division, the variations in the first demodulation signal shown in the example of FIGS. 3A to 3D can be corrected. FIG. 5A is suitable for correcting the cases (FIGS. 3A and 3B) where the Hi level of the first demodulation signal becomes lower than VDD. On the contrary, FIG. 5B is suitable for correcting the case (FIG. 3C) where the Lo level of the first demodulation signal becomes higher than GND.

The output amplitude of the differential amplifier does not become VDD completely, but the differential amplifier is advantageous in that the first demodulation signal having small amplitude can be amplified to be corrected. Accordingly, in the case of using a differential amplifier as a correction circuit, it is preferable to set the amplitude of the signal to be VDD by providing the inverter 501 later. Then, by inputting the second demodulation signal outputted from the correction circuit to the logic circuit, a malfunction of the semiconductor device can be prevented.

Further, the correction circuit included in a semiconductor device of the invention is not limited to the configuration of the differential amplifier described above. For example, a configuration in which an output of the differential amplifier is positively fed back via a resistor may be employed as well.

As described above, a semiconductor device of the invention having a demodulation signal generating circuit including a demodulation circuit and a correction circuit can reduce an effect of the variations in characteristics of the semiconductor element. Therefore, high yield of the semiconductor device of the invention can be realized and thus an inexpensive semiconductor device can be provided.

This embodiment mode can be freely implemented in combination with Embodiment Mode 1, Embodiments 1 and 2.

Embodiment 1

A semiconductor device of the invention is mainly formed of semiconductor elements. In this embodiment, description is made with reference to cross sectional diagrams on an example of manufacturing the semiconductor elements. Hereafter, the semiconductor elements are collectively referred to as an element group.

In this embodiment, an element group is formed over a glass substrate. After that, the element group is peeled off the substrate and attached to a flexible substrate (including a film and the like) in order to provide added values such as lightweight and flexibility to the semiconductor device.

Figure 6A:
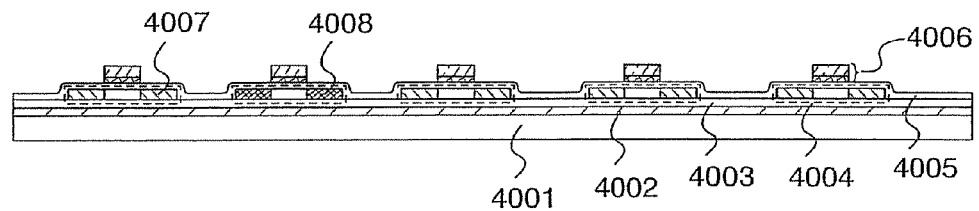
FIGS. 6A to 6D are diagrams showing manufacturing steps of a semiconductor device of the invention.

First, a peeling layer 4002 is formed over a glass substrate 4001 (see FIG. 6A). The substrate may be formed of quartz, silicon, metal, and the like as well as glass. The peeling layer 4002 is formed over an entire surface or a part of the substrate using an element such as a metal or silicon, or a compound thereof, or the like. It is to be noted that the peeling layer 4002 is not required to be formed in the case of forming a semiconductor device over the glass substrate 4001. Subsequently, an insulating layer 4003 is formed so as to cover the peeling layer 4002. The insulating layer 4003 is formed of silicon oxide, silicon nitride, and the like. Next, a semiconductor layer 4004 is formed over the insulating layer 4003 and crystallized by laser crystallization, thermal crystallization using a metal catalyst, and the like, and then etched into a desired shape. Next, a gate insulating layer 4005 is formed so as to cover the semiconductor layer 4004. The gate insulating layer 4005 is formed of silicon oxide, silicon nitride, and the like.

Figure 6B:
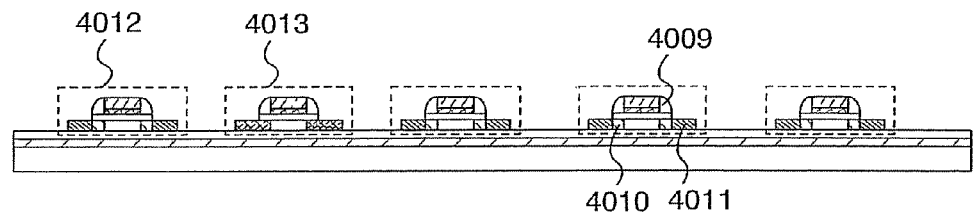

Subsequently, a gate electrode layer 4006 is formed. The gate electrode layer 4006 is formed of an element or a compound which is conductive, and then etched into a desired shape. In the case of employing a photolithography method, a width of the gate electrode is formed short by etching a resist mask by plasma and the like, thereby a performance of a transistor can be enhanced. In this embodiment, the gate electrode layer 4006 has a stacked-layer structure. Subsequently, an N-type impurity region 4007 and a P-type impurity region 4008 are formed by adding impurity elements to the semiconductor layer 4004. The impurity regions are formed by forming a resist mask by the photolithography method and adding impurity elements such as phosphorus, arsenic, and boron. Next, an insulating layer is formed of a nitrogenous substance and the like, and then applied anisotropic etching in a vertical direction, thereby an insulating layer 4009 (also referred to as a sidewall) in contact with a side surface of the gate electrode is formed (see FIG. 6B). Next, an impurity is added to a semiconductor layer including the N-type impurity region, thereby a first N-type impurity region 4010 directly below the insulating layer 4009 and a second N-type impurity region 4011 including a higher impurity concentration than the first impurity region are formed. By the aforementioned steps, an N-type transistor 4012 and a P-type transistor 4013 are formed.

Figure 6C:
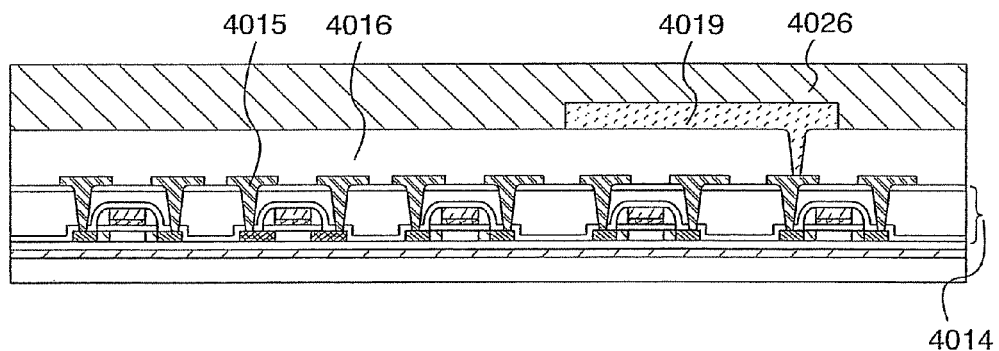

Next, an insulating layer 4014 is formed so as to cover the transistors 4012 and 4013 (see FIG. 6C). The insulating layer 4014 is formed of an inorganic compound, an organic compound, and the like having an insulating property. In this embodiment, the insulating layer 4014 is formed of a stacked-layer structure. Next, contact holes to expose the second N-type impurity region 4011 and the P-type impurity region 4008 are formed and a conductive layer 4015 is formed so as to fill the contact holes, and then etched the conductive layer 4015 into a desired shape. The conductive layer 4015 is formed of a metal element and compound thereof having a conductive property. Next, an insulating layer 4016 is formed so as to cover the conductive layer 4015. The insulating layer 4016 is formed of an inorganic compound, an organic compound, and the like each having an insulating property. Next, contact holes to expose the conductive layer 4015 are formed and a conductive layer is formed so as to fill the contact holes, and then etched the conductive layer into a desired shape to form an antenna or a wire for connecting the antenna. Subsequently, a protective layer 4026 is formed so as to cover the conductive layer forming an antenna 4019. The protective layer 4026 is formed of a compound, a resin, and the like each having an insulating property.

Figure 6D:
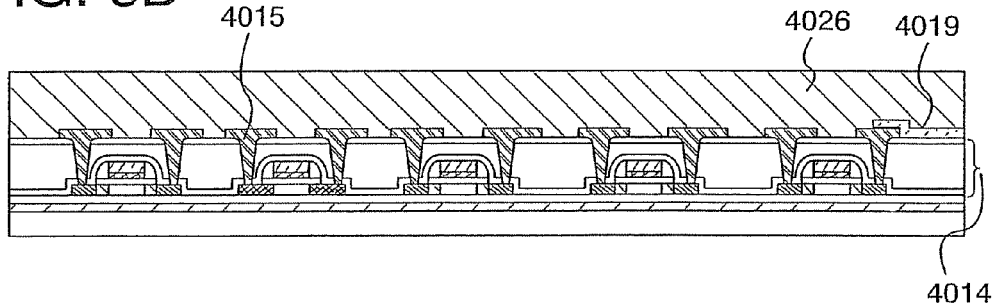

Each layer forming an insulating layer, a conductive layer, and an element may have a single layer structure using a single material or a stacked-layer structure using a plurality of materials. Further, in the aforementioned steps, the antenna 4019 is formed over the insulating layer 4016, however, the antenna 4019 may be formed in the same layer as the conductive layer 4015. (FIG. 6D)

A semiconductor layer included in the semiconductor element manufactured by the aforementioned steps may use any one of an amorphous semiconductor, a microcrystalline semiconductor, a polycrystalline semiconductor, an organic semiconductor, and the like. In order to obtain a semiconductor element with favorable characteristics, a crystalline semiconductor layer (a low temperature polysilicon layer) crystallized at 200 to 600° C. (preferably 350 to 500° C.) and a crystalline semiconductor layer (a high temperature polysilicon layer) crystallized at 600° C. or higher can be used. To obtain a semiconductor element with further favorable characteristics, a semiconductor layer crystallized using a metal element as a catalyst and a semiconductor layer crystallized by laser may be used. Further, a semiconductor layer formed using a mixture gas of $SiH_4$ and $F_2$, a mixture gas of $SiH_4$ and $H_2$, and the like, or the semiconductor layer irradiated with laser may be used as well. A semiconductor layer included in a semiconductor layer in a circuit may be fowled so as to have a crystal boundary which extends in parallel to a direction of carrier flow (a channel length direction). Such a semiconductor layer may be formed by a continuous oscillation laser (abbreviated as CWLC) or a pulsed laser which operates at 10 MHz or higher (preferably 60 to 100 MHz).

Further, the semiconductor layer may be formed with a thickness of 20 to 200 nm (preferably 50 to 150 nm). Moreover, by adding hydrogen or halogen elements to the semiconductor layer (in particular, a channel forming region thereof) at a concentration of $1\times10^{19}$ to $1\times10^{22}$ atoms/cm$^3$ (preferably a concentration of $1\times10^{19}$ to $5\times10^{20}$ atoms/cm$^3$), an active layer which has less defects and does not easily generate a crack can be obtained.

A transistor manufactured as described above has an S value (sub-threshold value) of 0.35 V/sec or lower (preferably 0.09 to 0.25 V/sec). Further, mobility is preferably 10 cm$^2$/Vs or higher. Further, the transistor preferably has characteristics of 1 MHz or higher (preferably 10 MHz or higher) with a ring oscillator which operates with a power source voltage of 3 to 5 V. Moreover, the transistor described in this embodiment has a structure in which a semiconductor layer, a gate insulating layer, and a gate electrode layer are sequentially stacked over a substrate, however, the invention is not limited to this example and a gate electrode layer, an insulating film, and a semiconductor layer may be sequentially stacked. Further, the N-type transistor of this embodiment includes a first N-type impurity region and a second N-type impurity region, however, the invention is not limited to this example and the impurity regions may all have the same impurity concentrations.

Further, the element group may be provided over a plurality of layers. In the case of forming a multi-layer structure, a low dielectric material is preferably used for a material of an interlayer insulating film for reducing parasitic capacitance between the layers. For example, a resin material such as an epoxy resin and an acrylic resin, a compound material formed of a polymer such as a siloxane-based polymer, and the like are suggested. When a multi-layer structure in which parasitic capacitance is reduced is employed, reduction in area, enhancement in operating speed, and reduction in power consumption can be realized. Further, reliability can be improved by providing a protective layer for preventing contamination of an alkaline metal. The protective layer is preferably formed of an inorganic material such as aluminum nitride or a silicon nitride film so as to cover an element in a circuit or a whole circuit.

Next, description is made on a method for peeling the element group formed as described above off the glass substrate 4001 and attaching it to a flexible substrate, a film, and the like. In the case of peeling the element group off the glass substrate 4001 and attaching it to a flexible substrate, a film, and the like, it is preferable that the element group is as thick as 5 μm or thinner (preferably 1 to 3 μm). Further, in the case of forming a semiconductor device of the invention, it is preferable that the element group is as large as 5 mm square or smaller (preferably 0.3 to 4 mm square).

Figure 7A:
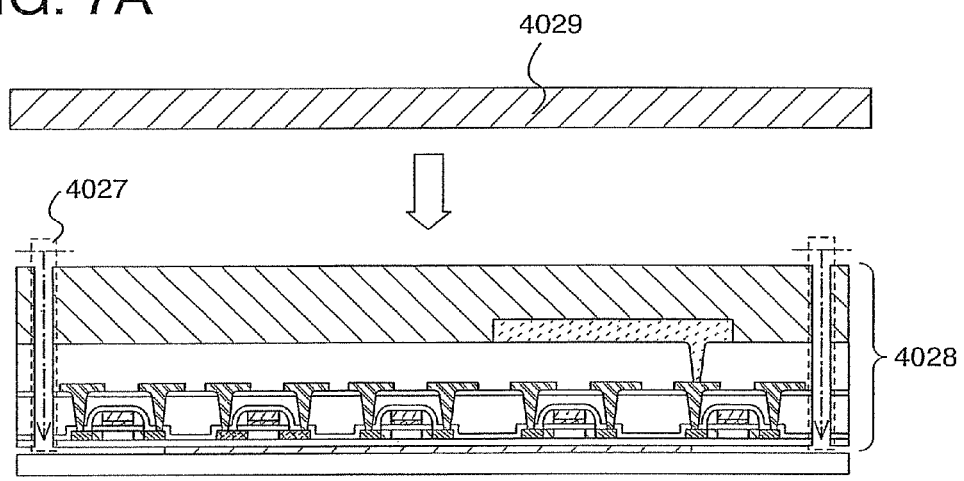
FIGS. 7A and 7B are diagrams showing manufacturing steps of a semiconductor device of the invention.
Figure 7B:
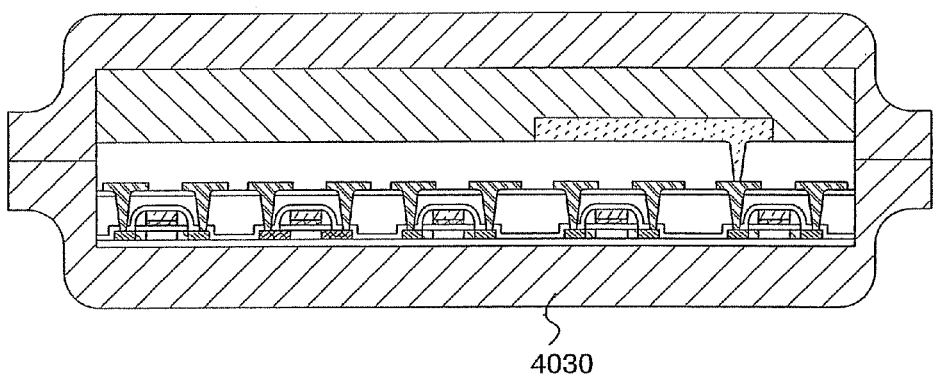

First, an aperture portion 4027 is fowled so as to expose the peeling layer 4002, which is partially removed by introducing an etchant to the aperture portion 4027 (see FIG. 7A). Next, a first flexible substrate 4029 is adhered from a direction of the top surface of the glass substrate, and then an element group 4028 is transferred from the glass substrate 4001 to the first flexible substrate 4029 side at a boundary of the peeling layer 4002. Subsequently, a flexible semiconductor device can be formed by adhering a second flexile substrate 4030 to a side where the element group 4028 was attached to the glass substrate 4001 (see FIG. 713). The flexible substrate may be a plastic film, paper, and the like. It is preferable to form the first flexible substrate 4029 and the second flexible substrate 4030 with the same thicknesses and to arrange the element group 4028 so as to be formed in the middle of the cross section in order to minimize an external effect.

In the aforementioned steps, when forming only a wire in the element group 4028 for connecting an antenna, instead of the antenna 4019, a semiconductor device can be formed by forming an antenna over the flexible substrate 4029 and attaching it to the element group 4028. Further, in the case of attaching the element group 4028 to a flexible substrate having a curvature, an effect to the semiconductor element can be reduced by arranging a carrier flow direction (channel length direction) of the semiconductor element so as not to be affected by the curvature.

Further, in this embodiment, description is made on a method for transferring the element group 4028 to the first flexible substrate 4029 after etching the peeling layer 4002 from the aperture portion 4027, however, the invention is not limited to this example. For example, a method for removing the peeling layer 4002 only by an etching step through the aperture portion 4027 and transferring the element group 4028 onto a flexible substrate, a method that the aperture portion 4027 is not provided and the first flexible substrate 4029 is attached to remove the element group 4028 from the glass substrate, a method for obtaining the element group 4028 by grinding the glass substrate 4001 from a back surface, and the like are suggested, and these methods may be used in combination. It is advantageous to employ a step of transferring the element group 4028 onto a flexible substrate besides the method for grinding the glass substrate from a back surface since the glass substrate 4001 for forming the element group 4028 can be reused.

This embodiment can be freely implemented in combination with Embodiment Modes 1 and 2, and Embodiment 2.

Embodiment 2

Description is made on specific application modes of a semiconductor device of the invention. The application range of a semiconductor device of the invention is wide and the invention can be applied to, for example, bills, coins, securities, certificates, bearer bonds, packaging containers, books, memory media, personal belongings, vehicles, groceries, garments, health products, daily commodities, medicals, electronic devices and the like.

The bills and coins are money that circulate in the market, including the ones that can be used in the same way as money in a specific area (cash voucher), a commemorative coin and the like. The securities include a check, a certificate, a promissory note and the like. The certificates include a driver's license, a resident's card and the like. The bearer bonds include a stamp, a rice coupon, various gift certificates and the like. The packaging containers include a packaging paper of a packed lunch, a plastic bottle and the like. The books include a magazine, a dictionary and the like. The memory media include a DVD software, a video tape and the like. The personal belongings include a bag, glasses, and the like. The vehicles include a wheeled vehicle such as a bicycle, a ship and the like. The groceries include foods, beverages and the like. The garments include clothes, shoes and the like. The health products include a medical apparatus, a health appliance and the like. The daily commodities include furniture, lighting and the like. The medicals include a medicine, an agricultural chemical and the like. The electronic devices include a liquid crystal display device, an EL display device, a television set (also referred to as a television receiver), a portable phone, a portable information terminal, and the like.

By providing a semiconductor device for bills, coins, securities, certificates, bearer bonds and the like, forgery can be prevented. Moreover, by providing a semiconductor device for packaging containers, books, memory media, personal belongings, groceries, daily commodities, electronic devices and the like, an inspection system and a system of a rental store and the like can be facilitated. By providing a semiconductor device for vehicles, health products, medicals and the like, forgery or stealing can be prevented and medication error can be prevented in the case of the medicals. The semiconductor device can be attached to the surface of the object or implanted therein. For example, the semiconductor device can be implanted in paper in the case of a book and can be implanted in an organic resin in the case of a package formed of the organic resin.

Figure 8A:
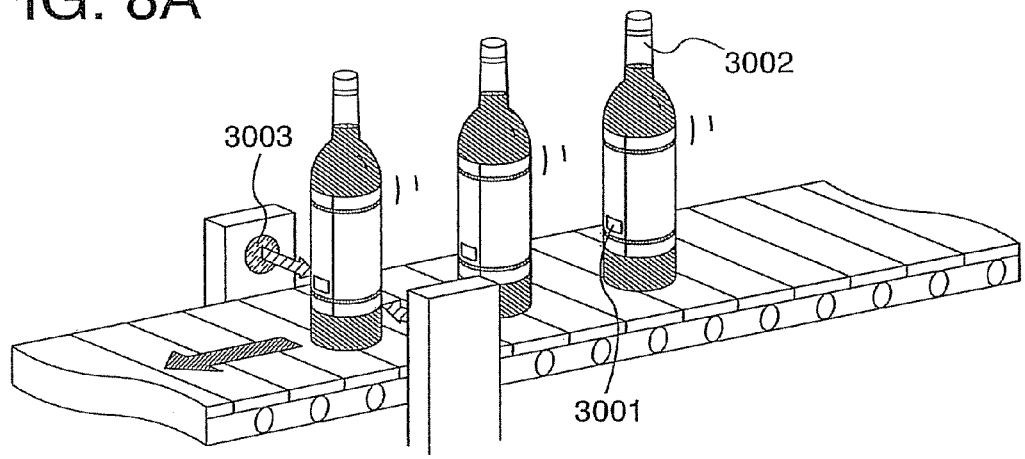
FIGS. 8A and 8B are diagrams showing application modes of a semiconductor device of the invention.

By applying a semiconductor device to the management and circulation system of objects, high functional system can be realized. For example, as shown in FIG. 8A, an object 3002 provided with a semiconductor device 3001 is carried by a belt conveyer and a reader/writer 3003 is provided beside the belt conveyer, thereby the object 3002 can be inspected easily.

Figure 8B:
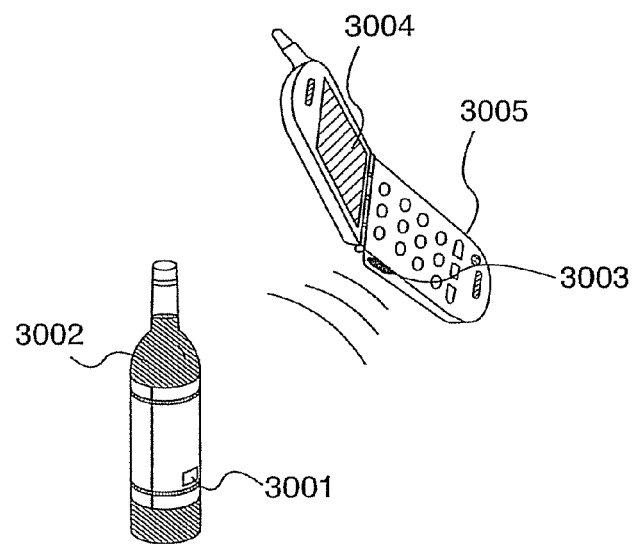

Further, as shown in FIG. 8B, a reader/writer 3003 is provided on a side surface of a portable terminal 3005 including a display portion 3004, thereby such a system can be realized that a material, a production area, a history of circulation, and the like of the object 3002 which is inspected in advance are displayed in the display portion 3004 by holding the reader/writer 3003 near a semiconductor device 3001 mounted to the object 3002.

This embodiment can be freely implemented in combination with Embodiment Modes 1 and 2, and Embodiment 1.

This application is based on Japanese Patent Application serial no. 2005-055197 filed in Japan Patent Office on 28, Feb. 2005, the entire contents of which are hereby incorporated by reference.

What is claimed is:

1. A semiconductor device comprising:
a demodulation circuit for demodulating an alternating signal and generating a first demodulation signal; and
an amplifier comprising:
a first line;
a second line; and
a first transistor and a second transistor which are connected to each other in series and electrically interposed between the first line and the second line,
wherein the first transistor and the second transistor are arranged so that, when the first line and the second line are respectively applied with a first power source voltage and a second power source voltage, a changing point of input-output characteristics of the amplifier is located at a voltage lower than a half value of a difference between the first power source voltage and the second power source voltage,
wherein the first demodulation signal is input to gates of the first transistor and the second transistor of the amplifier,
wherein the amplifier generates and outputs a second demodulation signal, and
wherein an amplitude of the second demodulation signal is equal to either an amplitude of the first power source voltage or an amplitude of the second power source voltage.

2. The semiconductor device according to claim 1,
wherein the first transistor and the second transistor are a P-channel transistor and an N-channel transistor, respectively, and
wherein a width of a channel of the second transistor is greater than a width of a channel of the first transistor.

3. The semiconductor device according to claim 1,
wherein the first transistor and the second transistor are a P-channel transistor and an N-channel transistor, respectively, and
wherein a length of a channel of the first transistor is greater than a length of a channel of the second transistor.

4. The semiconductor device according to claim 1,
wherein the first transistor and the second transistor are a P-channel transistor and an N-channel transistor, respectively, and
wherein an absolute value of a threshold voltage of the first transistor is greater than an absolute value of a threshold voltage of the second transistor.

5. The semiconductor device according to claim 1, wherein the changing point of input-output characteristics of the amplifier is located within a range of 25 to 45% of the first power source voltage.

6. The semiconductor device according to claim 1, further comprising a differential amplifier,
wherein an input terminal of the differential amplifier is electrically connected to an output terminal of the demodulation circuit, and
wherein an output terminal of the differential amplifier is electrically connected to an input terminal of the amplifier.

7. The semiconductor device according to claim 1, further comprising:
at least one of a power source circuit, a clock generating circuit, a memory, a memory control circuit, and a modulation circuit.

8. A semiconductor device comprising:
a demodulation circuit for demodulating an alternating signal and generating a first demodulation signal; and
an amplifier comprising:
a first line;
a second line; and
a first transistor and a second transistor which are connected to each other in series and electrically interposed between the first line and the second line,
wherein the first transistor and the second transistor are arranged so that, when the first line and the second line are respectively applied with a first power source voltage and a second power source voltage, a changing point of input-output characteristics of the amplifier is located at a voltage higher than a half value of a difference between the first power source voltage and the second power source voltage,
wherein the first demodulation signal is input to gates of the first transistor and the second transistor of the amplifier,
wherein the amplifier generates and outputs a second demodulation signal,
wherein an amplitude of the second demodulation signal is equal to either an amplitude of the first power source voltage or an amplitude of the second power source voltage.

9. The semiconductor device according to claim 8,
wherein the first transistor and the second transistor are a P-channel transistor and an N-channel transistor, respectively, and
wherein a width of a channel of the second transistor is smaller than a width of a channel of the first transistor.

10. The semiconductor device according to claim 8,
wherein the first transistor and the second transistor are a P-channel transistor and an N-channel transistor, respectively, and
wherein a length of a channel of the first transistor is smaller than a length of a channel of the second transistor.

11. The semiconductor device according to claim 8,
wherein the first transistor and the second transistor are a P-channel transistor and an N-channel transistor, respectively, and
wherein an absolute value of a threshold voltage of the first transistor is smaller than an absolute value of a threshold voltage of the second transistor.

12. The semiconductor device according to claim 8, wherein the changing point of input-output characteristics of the amplifier is located within a range of 55 to 75% of the first power source voltage.

13. The semiconductor device according to claim 8, further comprising a differential amplifier,
wherein an input terminal of the differential amplifier is electrically connected to an output terminal of the demodulation circuit, and
wherein an output terminal of the differential amplifier is electrically connected to an input terminal of the amplifier.

14. The semiconductor device according to claim 8, further comprising:
at least one of a power source circuit, a clock generating circuit, a memory, a memory control circuit, and a modulation circuit.

* * * * *